(12) United States Patent
Foong et al.

(10) Patent No.: US 6,383,843 B1
(45) Date of Patent: May 7, 2002

(54) USING REMOVABLE SPACERS TO ENSURE ADEQUATE BONDLINE THICKNESS

(75) Inventors: Sally Y. L. Foong, Milpitas, CA (US); Kok Khoon Ho, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/551,625

(22) Filed: Apr. 17, 2000

(51) Int. Cl.[7] .................. H01L 21/44; H01L 21/48; H01L 21/50; B32B 31/00
(52) U.S. Cl. .................. 438/118; 438/112; 156/152
(58) Field of Search .................. 438/112, 118; 156/152

(56) References Cited

U.S. PATENT DOCUMENTS 5,474,958 A * 12/1995 Djennas et al. ............. 437/211

* cited by examiner

Primary Examiner—Keith Chistenson
Assistant Examiner—Nema Berezny

(57) ABSTRACT

A method is provided for die bonding a semiconductor device to a substrate, which method provides adequate and consistent bondline thickness and assures that the die is spaced from the substrate a predetermined amount. Embodiments include removably attaching a flexible spacer of a predetermined thickness, such as a strip of paper or plastic, to the bonding pad of a substrate, such as an organic lead frame, so that it partially covers the bonding pad while leaving other parts of the bonding pad exposed. Die attach material, such as epoxy paste, is then applied to the exposed areas of the bonding pad, and a die is placed over the bonding pad in contact with the epoxy and the spacer. Due to the presence of the spacer, the die cannot sink when it is placed on the epoxy paste, resulting in a consistent bondline thickness equal to the spacer thickness. Thereafter, the epoxy paste is cured and the spacer removed, leaving a gap between the die and the lead frame of the predetermined spacer thickness, which is underfilled with plastic encapsulant material when the die is encapsulated. Thus, an ideal bondline thickness is consistently achieved, improving reliability at minimal additional cost, and no additional materials are introduced into the finished device which could adversely affect reliability.

9 Claims, 3 Drawing Sheets

USING REMOVABLE SPACERS TO ENSURE ADEQUATE BONDLINE THICKNESS

FIELD OF THE INVENTION

The present invention relates to a method for die bonding a semiconductor device onto a substrate. The present invention has particular applicability in assembling semiconductor devices into very thin packages having non-metallic lead frames.

BACKGROUND ART

In conventional semiconductor packaging techniques, a bare semiconductor device, called a "die", is attached to a substrate, such as a metal lead frame, using an adhesive die attach material such as epoxy in a process known as die bonding. The epoxy is typically applied to the lead frame as a wet paste prior to placing the die on the lead frame. Thus, a layer of epoxy separates the die and the substrate. After die bonding, wires are attached to electrically connect the semiconductor device to the lead frame, then the semiconductor device is encapsulated in a plastic material, as by molding.

Newer packaging technologies with reduced package thickness employ flexible non-metallic film-type lead frames to support the die prior to encapsulation, typically comprising organic materials such as polyimide (i.e. plastic) with embedded conductors. It has been determined that the reliability of flexible lead frame packages is improved when the die is separated from the lead frame a predetermined amount, such as 3–5 mils, as by the die attach material (epoxy). Thus, it is advantageous to apply the epoxy paste to a thickness of about 3–5 mils during the die bonding process. The thickness of the epoxy paste is known as the "bondline thickness". Due to the semi-liquid nature of the epoxy paste, the die typically sinks when it is placed on top of the paste, resulting in inadequate bondline thickness; e.g., only about 1 mil, which adversely affects reliability. Moreover, it is not possible to achieve a consistent bondline thickness from one device to another.

To achieve adequate and consistent bondline thickness, spacers can be incorporated into the die attach paste. However, this requires a specially formulated paste, which has different physical characteristics than conventional paste, thus requiring re-engineering of the die bonding process and raising the cost of the die bonding process. Furthermore, the spacers remain in the finished device, and can adversely affect reliability. Alternatively, thin rigid lead frames may be used instead of flexible lead frames. However, as packages are further reduced in size, such a solution will not continue to be viable, due to technical limitations arising in rigid substrates relating to the formation of fine-geometry conductors. Therefore, flexible film lead frames will need to be employed.

There exists a need for a cost-effective methodology for consistently bonding semiconductor dies to substrates such that each die has a predetermined standoff from the substrate to which it is bonded, without adversely affecting the reliability of the finished devices.

SUMMARY OF THE INVENTION

An advantage of the present invention is a method of die bonding a semiconductor device to a substrate which provides adequate and consistent bondline thickness, assuring that the die is spaced from the substrate a predetermined amount without adversely affecting the reliability of the finished device and without significantly increasing manufacturing costs.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of assembling a semiconductor device to a bonding area of a substrate, the method comprising positioning a spacer of a predetermined thickness on a first portion of the bonding area; applying an a die attach material on a second portion of the bonding area spaced apart from the first portion; placing the semiconductor device over the bonding area and in contact with the die attach material and the spacer; heating to cure the die attach material; and removing the spacer, thereby forming a gap between the semiconductor device and the substrate about equal to the predetermined thickness at the first portion of the bonding area.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for die bonding to thin flexible substrates result in inadequate bondline thickness, which adversely affects the reliability of the finished device and reduces manufacturing yield. The present invention addresses and solves these problems stemming from conventional manufacturing processes.

According to the methodology of the present invention, a flexible spacer of a predetermined thickness, such as a strip of paper or plastic, is removably attached to the bonding pad of a substrate, such as an organic lead frame, so that it partially covers the bonding pad while leaving other parts of the bonding pad exposed. Die attach material, such as epoxy paste, is then applied to the exposed areas of the bonding pad, and a die is placed over the bonding pad in contact with the epoxy and the spacer. Due to the presence of the spacer, the die cannot sink when it is placed on the epoxy paste, resulting in a consistent bondline thickness equal to the spacer thickness. Thereafter, the epoxy paste is cured and the spacer removed, leaving a gap between the die and the lead frame of the predetermined spacer thickness, which is underfilled with plastic encapsulant material when the die is encapsulated. Thus, the present methodology assures an ideal bondline thickness is consistently achieved at minimal additional cost, thereby improving the reliability and manufacturability of the finished device. Moreover, the present methodology does not introduce any additional materials into the finished device which could adversely affect reliability.

Figure 1A:
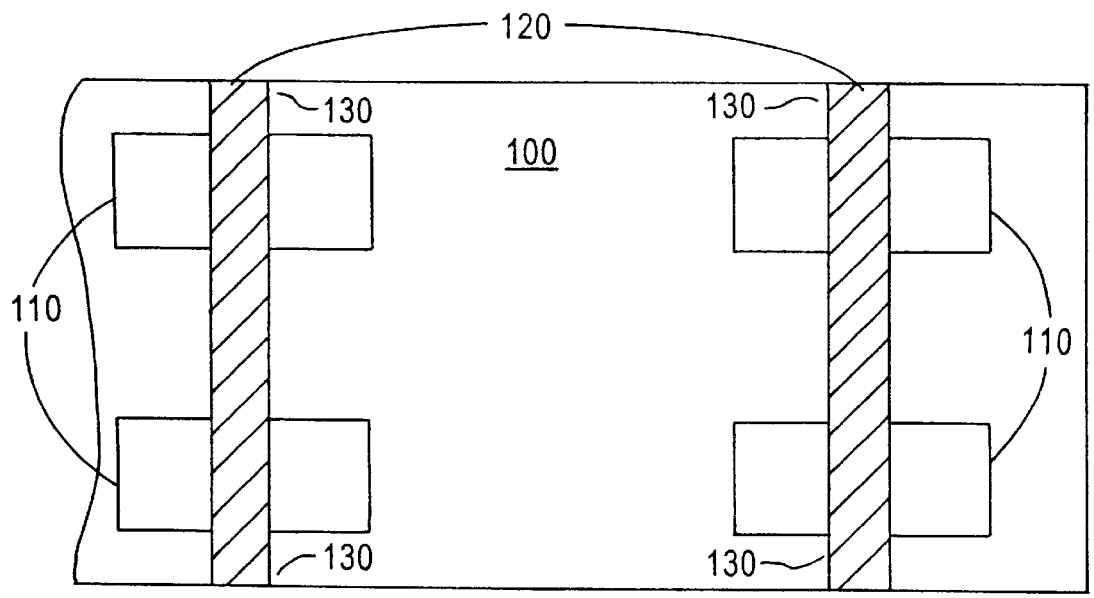
FIGS. 1A–1D schematically illustrate sequential phases of a method in accordance with an embodiment of the present invention.

An embodiment of the invention will now be described with reference to FIGS. 1A–1D and 2. FIG. 1A illustrates a lead frame 100, such as a flexible organic film-type lead frame, having bonding pads 110. Although this embodiment of the present invention is described as being employed in conduction with flexible lead frames such as organic lead frames or thin film tape substrates, one skilled in the art would recognize that the present methodology can be used for die bonding to any type of substrate (e.g., a rigid metal lead frame or a printed circuit board), whenever a uniform bondline thickness is desired.

At step 200, spacers 120 having a predetermined thickness t (see FIG. 1C) are removably attached to lead frame 100, preferably positioned on a central portion of bonding pads 110. Spacers 120 comprise a flexible material, preferably paper or a polymer, that can withstand the heated curing process of the subsequently applied die attach material. Thickness t is typically about 3 mils to about 5 mils, preferably greater than about 4 mils. Spacers 120 are removably attached to lead frame 100 at areas 130 outside bonding pads 110. Spacers 120 can be taped to lead frame 100, or glued to lead frame 100 with tape that loses its tackiness after curing, such as Scotch C-4220, available from 3-M of St. Paul, Minn. Spacers 120 can be applied to lead frame 100 manually or automatically.

Figure 1B:
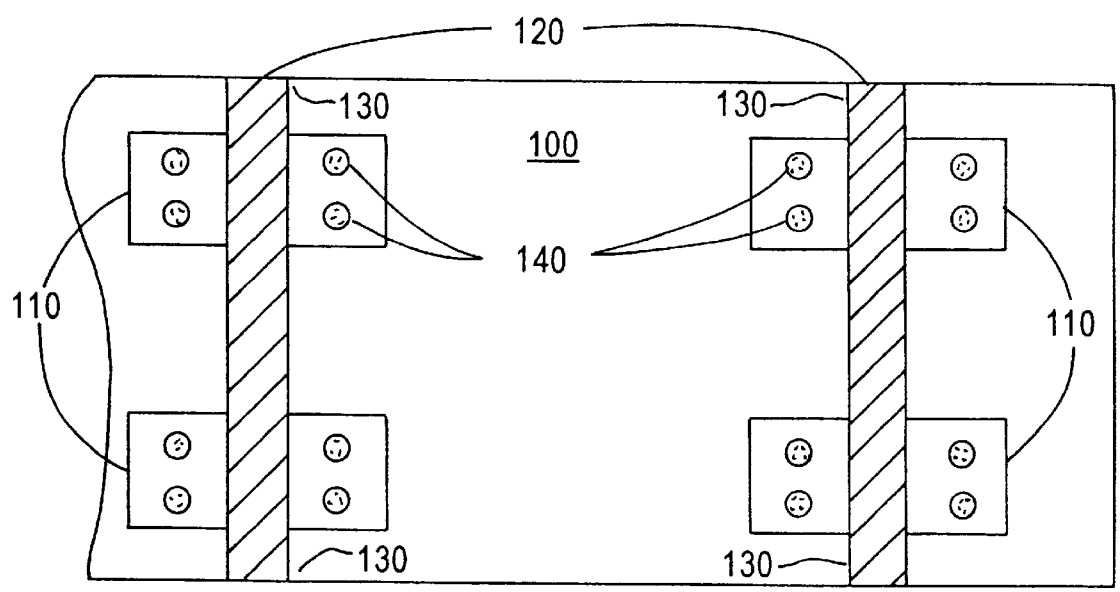
Figure 1C:
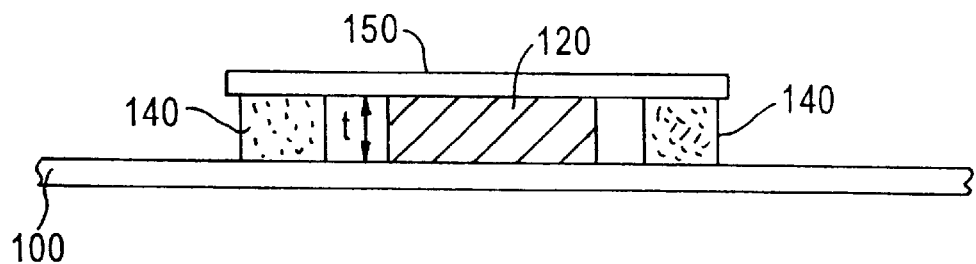

Referring now to FIG. 1B, at step 210, a die attach material 140, such as an epoxy paste with silver fill or silica fill, is dispensed in a conventional manner onto bonding pads 110 such that epoxy 140 does not contact spacers 120, in order to avoid epoxy 140 sticking to spacers 120. Since, as shown in FIG. 1B, spacers 120 are positioned in a central portion of bonding pads 110, and epoxy 140 is applied to opposing outer portions of bonding pads 110. Epoxy 140 is dispensed in a quantity sufficient to securely adhere the subsequently placed semiconductor dies to bonding pads 110 without epoxy 140 running off bonding pads 110 or contacting spacers 120.

Figure 1D:
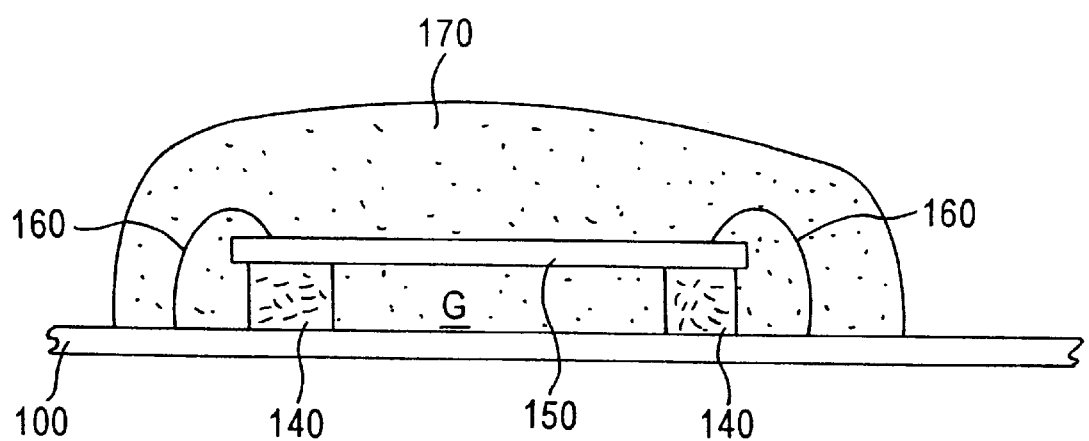
Figure 2:
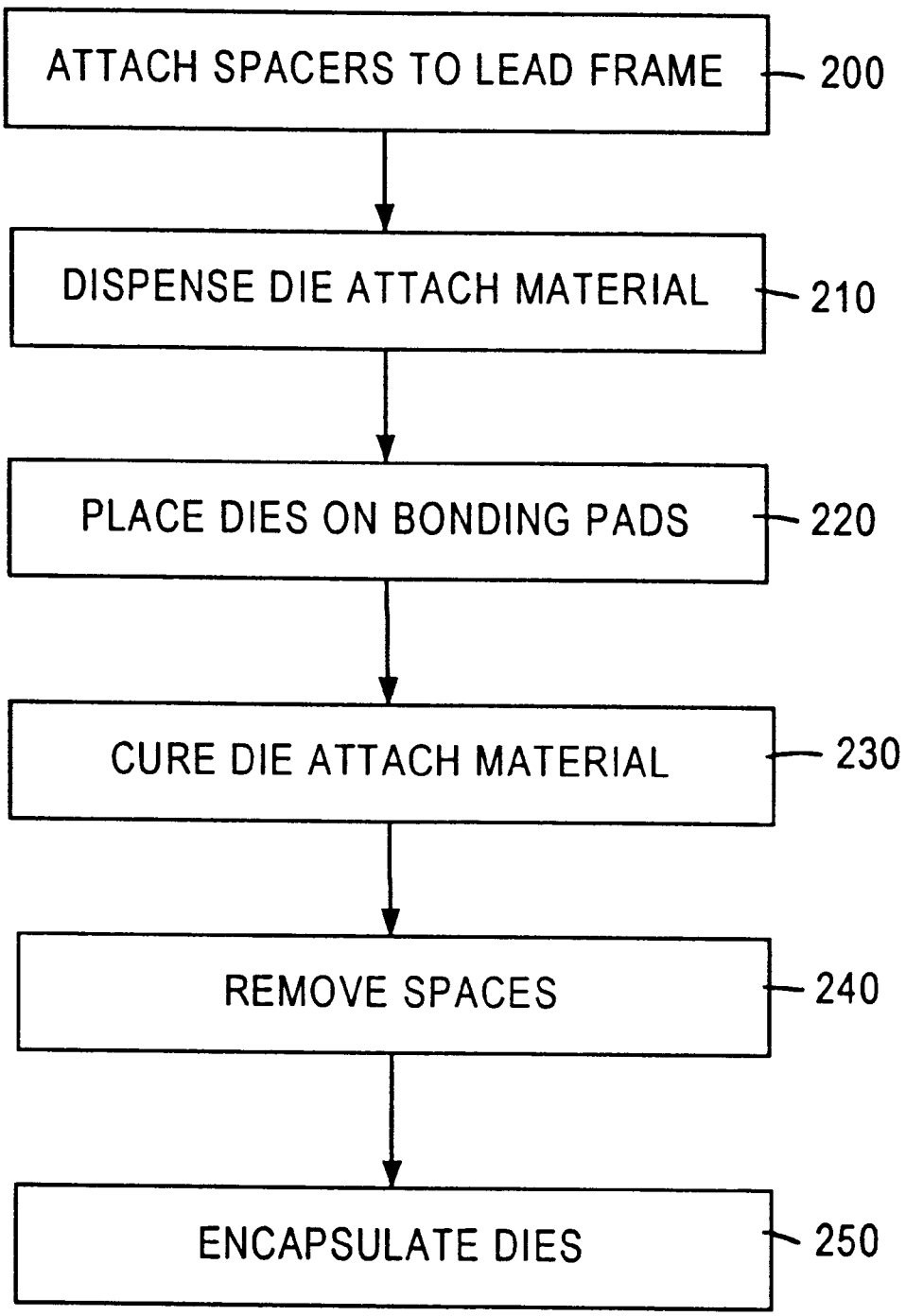
FIG. 2 is a flow chart illustrating a method in accordance with an embodiment of the present invention.

At step 220, a semiconductor die 150 is placed over each bonding pad 110 to contact epoxy 140 and spacer 120 (see FIG. 1C), as with a conventional die bonder. Thus, die 150 straddles spacer 120 and is separated from bonding pad 110 by thickness t of spacer 120. Next, epoxy 140 is cured in a conventional manner, as by heating in an oven (see step 230). Spacers 120 are then removed (see step 240), leaving a gap G between die 150 and bonding pad 110. Thereafter, as shown in FIG. 1D, wires 160 are attached to electrically connect die 150 to lead frame 100, as by conventional wire bonding techniques and, at step 250, die 150 is encapsulated in a conventional manner, as by dispensing encapsulation material 170, such as a polymer, over die 150. Encapsulation material 170 flows into gap G, preferably filling gap G.

The present invention provides a bondline thickness consistently equal to thickness t of spacers 120, improving reliability by optimizing separation of die 150 from lead frame 100. Moreover, the present methodology does not significantly increase production or engineering costs, since a conventionally formulated die attach epoxy 140 is employed. Furthermore, because spacers 120 are completely removed after the die bonding process, and gap G is filled in by encapsulant 170, the present methodology does not adversely affect the reliability of the finished devices.

The present invention is applicable to the manufacture of various types of semiconductor devices, particularly high-density semiconductor devices having a design rule of about 0.18 $\mu$, and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of assembling a semiconductor device to a bonding area of a substrate, the method comprising:

positioning a spacer of a predetermined thickness on a first portion of the bonding area;

removably attaching the spacer to a non-bonding area of the substrate separate from the bonding area;

applying a die attach material on a second portion of the bonding area spaced apart from the first portion;

placing the semiconductor device over the bonding area and in contact with the die attach material and the spacer;

heating to cure the die attach material; and removing the spacer, thereby forming a gap between the semiconductor device and the substrate about equal to the predetermined thickness at the first portion of the bonding area.

2. The method of claim 1, wherein the spacer comprises paper or polymer.

3. The method of claim 1, wherein the predetermined thickness is about 3 mils to about 5 mils.

4. The method of claim 1, comprising taping to removably attach the spacer.

5. The method of claim 1, comprising gluing to removably attach the spacer.

6. The method of claim 1, comprising positioning the spacer such that the semiconductor device straddles the spacer after the semiconductor device is placed over the bonding area.

7. The method of claim 1, wherein the bonding area is substantially rectangular, the first portion of the bonding area comprises a central portion of the bonding area, and second portion of the bonding area comprises a pair of opposing outer portions of the bonding area.

8. The method of claim 1, wherein the die attach material comprises epoxy.

9. The method of claim 1, comprising encapsulating the die with an encapsulant after removing the spacers, wherein the predetermined thickness is such that the encapsulant flows into the gap between the semiconductor device and the substrate.

* * * * *